United States Patent
Kong et al.

(10) Patent No.: US 9,246,515 B2
(45) Date of Patent: Jan. 26, 2016

(54) ERROR CORRECTION CODE BLOCK HAVING DUAL-SYNDROME GENERATOR, METHOD THEREOF, AND SYSTEM HAVING SAME

(75) Inventors: Jae Phil Kong, Seoul (KR); Seok-Won Ahn, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 291 days.

(21) Appl. No.: 13/340,818

(22) Filed: Dec. 30, 2011

(65) Prior Publication Data
US 2012/0173951 A1 Jul. 5, 2012

Related U.S. Application Data

(60) Provisional application No. 61/428,273, filed on Dec. 30, 2010.

(51) Int. Cl.
*H03M 13/00* (2006.01)
*H03M 13/15* (2006.01)
*G06F 11/10* (2006.01)

(52) U.S. Cl.
CPC ........... *H03M 13/1515* (2013.01); *G06F 11/10* (2013.01); *H03M 13/152* (2013.01); *H03M 13/159* (2013.01); *H03M 13/1545* (2013.01); *H03M 13/6561* (2013.01)

(58) Field of Classification Search
CPC .......... H03M 13/1515; H03M 13/152; H03M 13/1545; H03M 13/159; H03M 13/6561
USPC ................................................... 714/785, 816
See application file for complete search history.

(56) References Cited

U.S. PATENT DOCUMENTS

| | | | |
|---|---|---|---|
| 5,216,676 A | | 6/1993 | Kimura |
| 5,260,952 A | * | 11/1993 | Beilstein et al. .............. 714/816 |
| 6,115,837 A | * | 9/2000 | Nguyen et al. ................ 714/769 |
| 6,301,682 B1 | * | 10/2001 | Knefel .......................... 714/752 |
| 7,010,576 B2 | | 3/2006 | Bae |
| 8,173,417 B2 | * | 5/2012 | Tan et al. .................... 435/287.2 |
| 2009/0070656 A1 | * | 3/2009 | Jo et al. ......................... 714/763 |
| 2010/0125776 A1 | * | 5/2010 | Mutchnik et al. ............. 714/785 |
| 2013/0254635 A1 | * | 9/2013 | Anholt .......................... 714/781 |

FOREIGN PATENT DOCUMENTS

| | | |
|---|---|---|
| JP | 10254788 A | 9/1998 |
| JP | 2000323994 A | 11/2000 |
| KR | 9113755 A | 8/1991 |

* cited by examiner

*Primary Examiner* — Sam Rizk
(74) *Attorney, Agent, or Firm* — Harness, Dickey & Pierce, P.L.C.

(57) ABSTRACT

An error correction code block including dual-syndrome generators, which may process a plurality of successive code word without latency, is configured to calculate syndrome values of a corresponding even numbered codeword among the plurality of code words by using one of the dual-syndrome generators, and is configured to calculate syndrome values of a corresponding odd numbered codeword among the plurality of code words by using the other of the dual-syndrome generators.

23 Claims, 8 Drawing Sheets

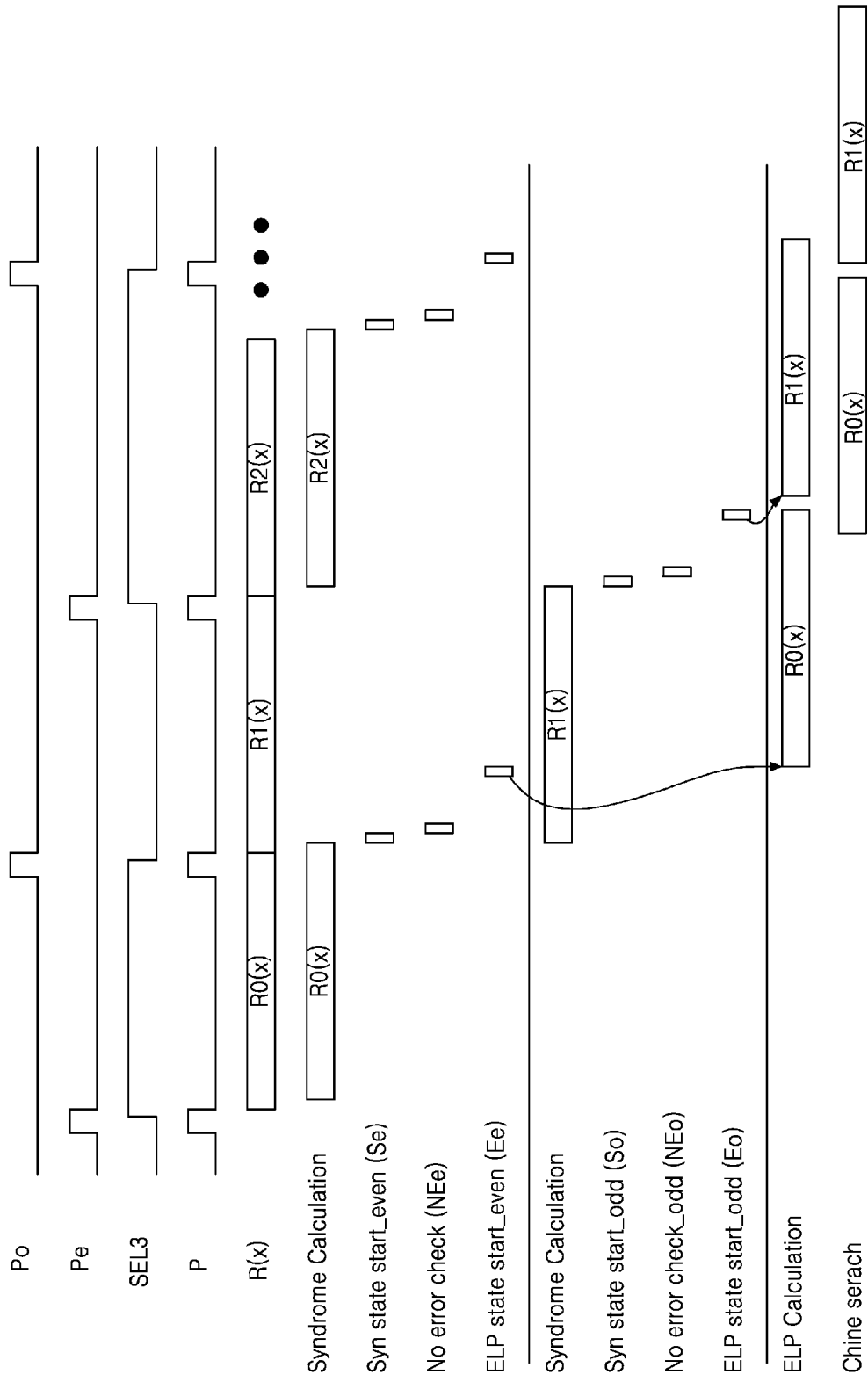

ERROR CORRECTION CODE BLOCK HAVING DUAL-SYNDROME GENERATOR, METHOD THEREOF, AND SYSTEM HAVING SAME

CROSS-REFERENCE TO RELATED APPLICATIONS

This application claims the priority benefit of U.S. provisional patent application No. 61/428,273 filed on 30 Dec. 2010, the disclosure of which is hereby incorporated herein by reference in its entirety.

BACKGROUND

Embodiments of the present inventive concepts relate to error correction technology.

In a data processing system, data may be changed during a transmission. Accordingly, changed data should be detected and corrected for reliable communication. As a method of detecting changed data, parity check, cyclical redundancy check or checksum is used.

As a method of correcting an error included in the data, there is a method that a receiving device requires a transmitting device to re-transmit the data or a method that a receiving device corrects automatically an error included in the data by using a error correction code.

An error correction decoder is used to correct an error included in data read from a memory.

SUMMARY

The present general inventive concepts provide an error correction code block including a dual-syndrome generator, which may process a plurality of continuous code words without latency to increase data processing performance, an operation method thereof and/or a system including the error correction code block.

At least one embodiment is directed to an error correction code circuit.

An example embodiment of an error correction code (ECC) circuit includes a first syndrome generator, a second syndrome generator, and a first selector. The first selector is configured to transmit an even numbered codeword among a plurality of code words continuously input to the first syndrome generator or transmit an odd numbered codeword among the plurality of code words to the second syndrome generator in response to a first selection signal SEL1.

The ECC circuit further includes a pulse generator configured to generate a plurality of pulses having a cycle in response to a clock signal CLK, and a counter configured to count the number of the plurality of pulses and generate the first selection signal according to a count result.

The cycle may be determined according to each bit number of the plurality of code words.

The first syndrome generator, based on a previous codeword stored in a first register and a current even numbered codeword, is configured to calculate syndrome values of the current even-numbered codeword and output calculated syndrome values to the first register. The second syndrome generator, based on a previous codeword stored in a second register and a current odd-numbered codeword, is configured to calculate syndrome values of the current odd-numbered codeword and output calculated syndrome values to the second register.

According to an example embodiment, the ECC circuit further includes a second selector configured to transmit syndrome values output from the first register or the second register to an error locator polynomial generation circuit in response to a second selection signal.

According to another example embodiment, the ECC circuit further includes a second selector configured to transmit syndrome values of the even numbered codeword generated by the first syndrome generator or syndrome values of the odd-numbered codeword generated by the second syndrome generator to the error locator polynomial generation circuit in response to a second selection signal.

According to still another example embodiment, the ECC circuit further includes a pulse generator configured to generate a plurality of pulses having a determined cycle according to each bit number of the plurality of code words in response to a clock signal, a one-bit counter configured to count the number of the plurality of pulses and generating a third selection signal, a third selector configured to output the plurality of pulses to a first output terminal or a second output terminal according to the third selection signal, a first counter configured to count a clock signal after being initialized in response to an output signal of the first output terminal and configured to output a first start signal corresponding to a result of comparing a count value with a reference value, a first state machine configured to output the second selection signal in response to the first start signal, a second counter configured to count the clock signal after being initialized in response to an output signal of the second output terminal and configured to output a second start signal corresponding to a result of comparing a count value with the reference value, and a second state machine configured to output the second selection signal in response to the second start signal.

The first selector may be a de-multiplexer and the second selector may be a multiplexer.

According to still another example embodiment, the ECC circuit includes a pulse generator configured to generate a plurality of pulses having a cycle according to each bit number of the plurality of code words in response to a clock signal, a second selector configured to output an even numbered pulse among the plurality of pulses to a first output terminal and configured to output an odd numbered pulse among the plurality of pulses to a second output terminal in response to the first selection signal, a first counter configured to count a clock signal after being initialized in response to an output signal of the first output terminal and configured to output a first start signal corresponding to a result of comparing a count value with a reference value, a first state machine configured to output the second selection signal in response to the first start signal, a second counter configured to count the clock signal after being initialized in response to an output signal of the second output terminal and configured to output a second start signal corresponding to a result of comparing a count value with the reference value, and a second state machine configured to output the second selection signal in response to the second start signal.

At least another embodiment of the error correction code circuit includes at least first and second processing paths. The first processing path is configured to generate syndrome values for a first series of codewords output from a memory, and the second processing path is configured to generate syndrome values for a second series of codewords output from the memory. The first and second series of codewords include different codewords.

At least another example embodiment is directed to a system.

In one embodiment the system includes a first-in first-out (FIFO) buffer configured to receive a plurality of code words output continuously from a memory, a data buffer configured to store the plurality of code words output from the FIFO buffer, an error correction code(ECC) circuit configured to generate syndrome values by using a syndrome generator, which is selected according to an order of the plurality of code words output from the memory among a plurality of syndrome generators, calculate an error locator polynomial from generated syndrome values, calculate roots of a calculated error locator polynomial and configured to output a plurality of error locators from calculated roots, a correction direct memory access(DMA) configured to correct an error included in a codeword read from the data buffer by codeword and store an error-corrected codeword in the data buffer, and a host interface configured to transmit the error-corrected codeword stored in the correction DMA to a host.

When the plurality of syndrome generators include a first syndrome generator and a second syndrome generator, the ECC circuit includes a first selector configured to transmit an even numbered codeword among the plurality of code words to the first syndrome generator or configured to transmit an odd numbered code word among the plurality of code words to the second syndrome generator in response to a first selection signal generated according to the order, a second selector configured to output syndrome values output from the first syndrome generator 120 or the second syndrome generator in response to a second selection signal generated according to the order, an error locator polynomial generator configured to calculate the error location polynomial from syndrome values output from the second selector, and an error locator calculator configured to calculate roots of the error locator polynomial and output the plurality of error locators according to a calculation result. The system may be mobile phone, a smart phone, a tablet PC or a memory card.

BRIEF DESCRIPTION OF THE DRAWINGS

These and/or other aspects and advantages of the present general inventive concepts will become apparent and more readily appreciated from the following description of the embodiments, taken in conjunction with the accompanying drawings of which:

FIG. 8 is a timing diagram for explaining an operation of the dual-syndrome generator illustrated in FIG. 1.

DETAILED DESCRIPTION

Figure 1:
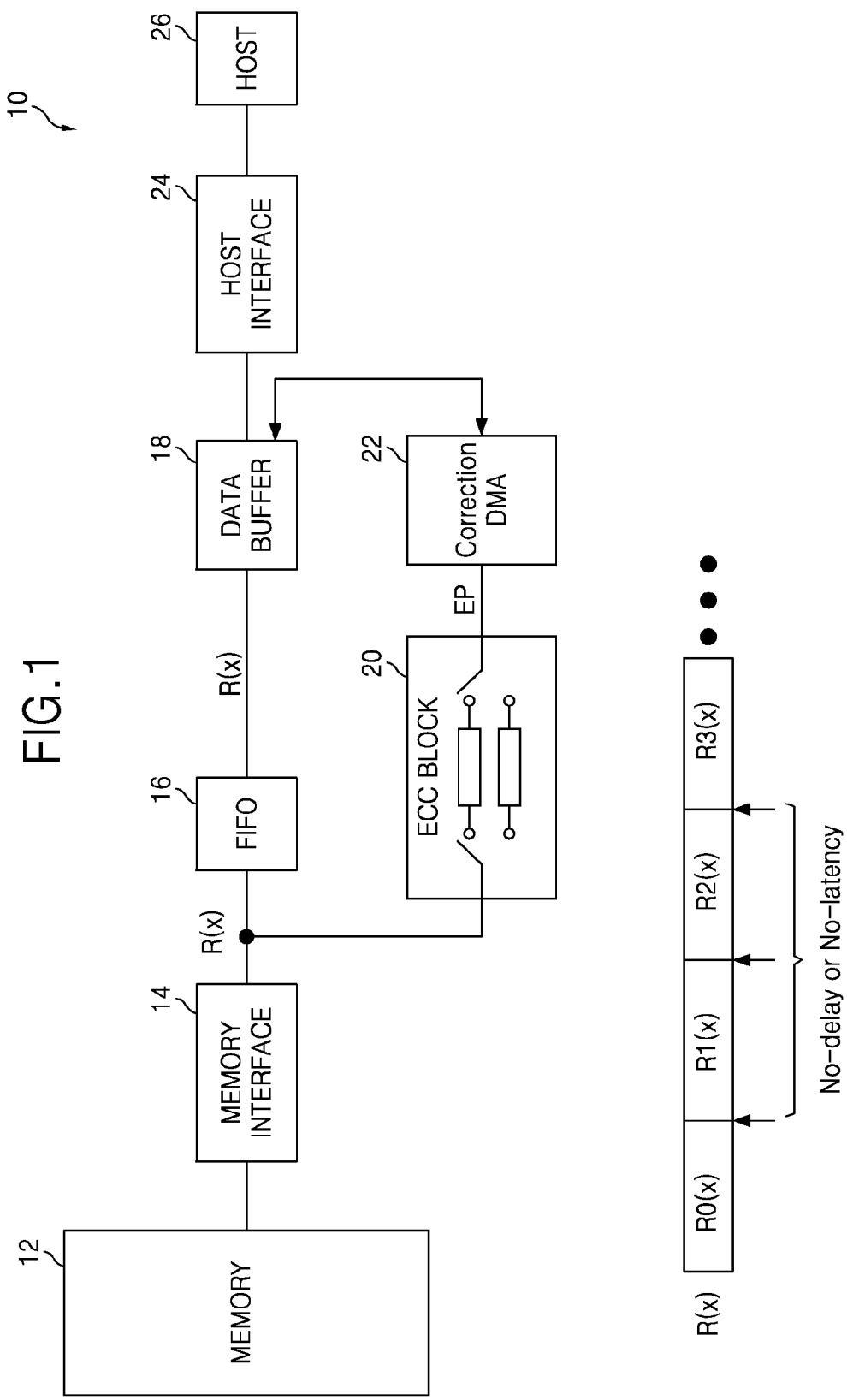
FIG. 1 is a block diagram of a system including an error correction code block including a dual-syndrome generator according to an example embodiment of inventive concepts.

Example embodiments now will be described more fully hereinafter with reference to the accompanying drawings, in which embodiments are shown. The example embodiment may, however, be embodied in many different forms and should not be construed as limited to those set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a system including an error correction code block including a dual-syndrome generator according to an example embodiment of inventive concepts.

Referring to FIG. 1, the system 10 includes a memory 12, a memory interface 14, a first-in first-out (FIFO) buffer 16, a data buffer 18, an error correction code (ECC) block or an ECC circuit 20, a correction direct memory access (DMA) or a DMA circuit 22, a host interface 24 and a host 26.

The system 10 may be embodied in a personal computer (PC), a tablet PC, a laptop computer, a memory card, a smart card, a mobile phone, a smart phone, a data server, a hard disk drive (HDD), a solid state drive (SSD), or a network-attached storage (NAS).

The memory 12 stores a plurality of code words R(x) and transmits a plurality of code words R(x), which are continuous without latency to a memory interface 14 during a read operation.

The memory 12 may be embodied in a memory including a volatile memory cell or a memory including a non-volatile memory cell.

The volatile memory cell means a currently existing volatile memory cell such as a dynamic random access memory (DRAM), a static random access memory (SRAM), a thyristor RAM (T-RAM), a zero capacitor RAM (Z-RAM) or Twin Transistor RAM (TTRAM), and a volatile memory cell which is being developed.

In addition, the non-volatile memory cell may include an Electrically Erasable Programmable Read-Only Memory (EEPROM), a flash memory, a Magnetic RAM (MRAM), a Spin-Transfer Torque MRAM, a Conductive bridging RAM (CBRAM), a Ferroelectric RAM (FeRAM), a Phase change RAM (PRAM) which is also called an Ovonic Unified Memory (OUM), a Resistive RAM (RRAM or ReRAM), a Nanotube RRAM, a Polymer RAM (PoRAM), a Nano floating gate memory (NFGM), a holographic memory, a Molecular Electronics Memory Device or an Insulator Resistance Change Memory. The non-volatile memory cell may store one-bit or more.

The memory interface 14 interfaces data transmitted or received between the memory 12 and a FIFO 16. For example, the memory interface 14 may convert data output from the memory 12 during a read operation into data which may be processed by the FIFO 16 or an ECC block 20. Moreover, the memory interface 14 may convert data output from the FIFO 16 during a write or a program operation into data which the memory 12 may process.

The FIFO 16 may store burst code words input through the memory interface 14 successively. The data buffer 18 may store a code word output successively from the FIFO 16. For example, the data buffer 18 may be embodied in a dual-port static random access memory (SRAM).

The ECC block 20 including a dual syndrome generator may generate syndrome values from a plurality of burst code words R(x), which are input successively through a single channel or a single data bus, calculate error locator polynomials $\Lambda(x)$ from the syndrome values, calculate roots of calculated error location polynomials, and output a plurality of error locations EP from calculated roots.

As illustrated in FIG. 1, when a time taken to calculate an error locator polynomial and a Chien search time are included in a time taken to transmit a codeword(s), there is no delay or latency between a plurality of continuous code words R(x). Accordingly, a system 10 including the ECC block 20 having a dual-syndrome generator may perform a high-speed operation.

A structure and an operation of the ECC block 20 will be explained in detail referring to FIG. 2.

The correction DMA 22 receives a codeword read from a data buffer 18 and a plurality of error locators (or error locations) EP output from the ECC block 20, and corrects an error included in a read codeword by using the plurality of error locators EP. The data buffer 18 stores the error-corrected code word. The correction DMA 22 is an example of an error corrector.

A host interface 24 interfaces data transmitted or received between the data buffer 18 and a host 26. For example, during a read operation, the host interface 24 may convert data output from the data buffer 18 into data which the host 26 may process. Moreover, during a write or a program operation, the host interface 24 may convert data output from the host 26 into data which the data buffer 18 may process.

Figure 2:
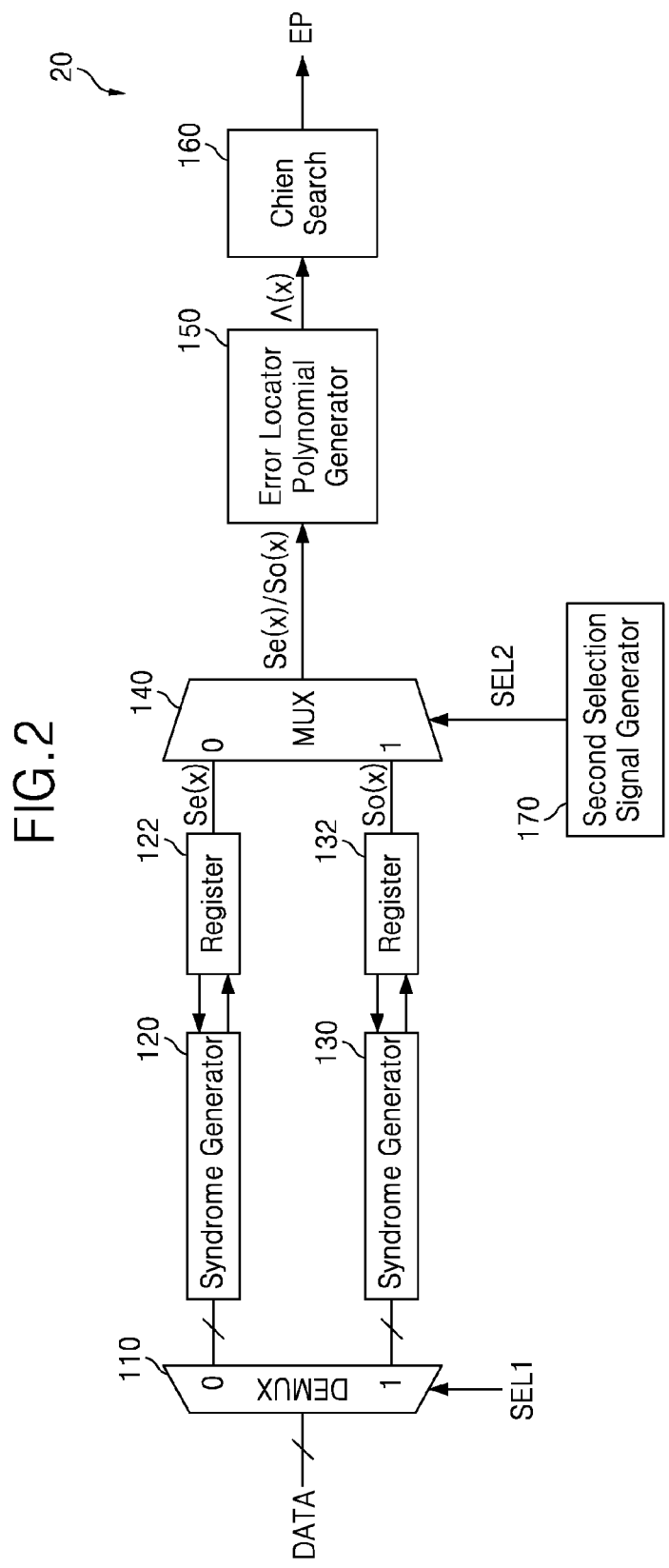
FIG. 2 is a block diagram of an error correction code block including the dual-syndrome generator illustrated in FIG. 1.

FIG. 2 is a block diagram of an error correction code block including the dual-syndrome generator illustrated in FIG. 1. Referring to FIG. 2, the ECC block 20 including a dual-syndrome generator 120 and 130 includes a first selector 110, a first syndrome generator 120, a first register 122, a second syndrome generator 130, a second register 132, a second selector 140 and a second selection signal generator 170.

The ECC block 20 further includes an error locator polynomial generator 150 and a Chien search 160. Components further included in the ECC block 20 may be determined according to whether the ECC block 20 performs ECC by using a BCH code or a Reed-Solomon (RS) code.

The first selector 110, which may be embodied in a de-multiplexer, transmits an even numbered codeword R0(x), R2(x), . . . among a plurality of code words R(x)=DATA or a plurality of chunks, which are continuously input, to the first syndrome generator 120 through a first output terminal 0 in response to a first selection signal SEL1 having a first state, for example low level. When a time taken to calculate an error locator polynomial and a Chien search time are included in a time taken to transmit a codeword(s), latency or delay between a plurality of code words Ri(x), x=0, 1, 2, . . . is 0. For convenience of explanation, a first codeword R0(x) is defined as an even numbered codeword.

In addition, the first selector 110 transmits an odd numbered codeword R1(x), R3(x), . . . among a plurality of code words R(x), which are input continuously, to a second syndrome generator 130 through a second output terminal 1 in response to a first selection signal SEL1 having a second state, for example high level.

Figure 3:
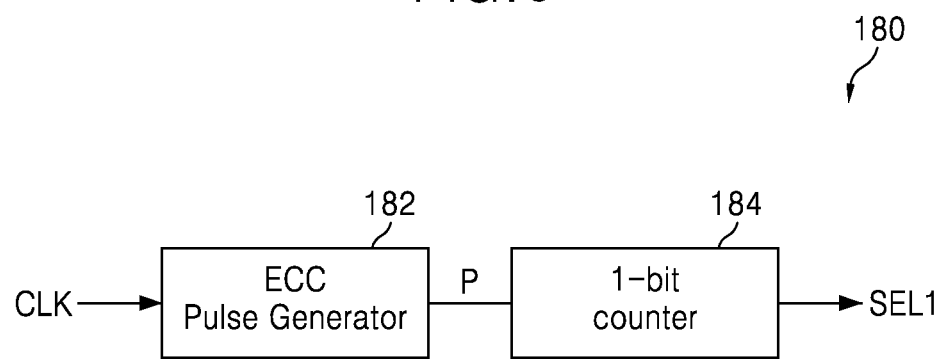
FIG. 3 is a block diagram of a first selection signal generator.

According to embodiments, the first selection signal SEL1 may be input from outside of the ECC block 20 as illustrated in FIG. 3 and described below, or generated inside the ECC block 20.

For example, a first selection signal SEL1 may be a least significant bit (LSB) among sequence (order) information indicating an order of each of the plurality of code words R(x). For example, when the plurality of code words R(x) are 8 and the sequence information is 3-bits, the first selection signal SEL1 may be an LSB of the 3-bits.

The first syndrome generator 120 calculates syndrome values from an even numbered code word transmitted from the first selector 110. That is, the first syndrome generator 120 calculates a syndrome value based on a current data and a previous data, which is feedback from a first register 122, in response to a clock signal, and outputs a calculated syndrome value to the first register 122. The first register 122 stores the syndrome value.

The second syndrome generator 130 calculates syndrome values from an odd numbered codeword transmitted from the first selector 110. That is, the second syndrome generator 130 calculates a syndrome value based on a current data and a previous data, which is feedback from the second register 132, in response to a clock signal, and outputs a calculated syndrome value to the second register 132. The second register 132 stores the syndrome value.

The second selector 140, which may be embodied in a multiplexer, transmits even numbered syndrome values Se(x) output from the first register 122 or odd numbered syndrome values So(x) output from the second register 132 to an error locator polynomial generator 150 according to a second selection signal SEL2.

The second selection signal SEL2 may be generated by a second selection signal generator 170.

The error locator polynomial generator 150 functioning as a key equation solver calculates an error locator polynomial $\Lambda(x)$ or coefficients of the error locator polynomial from syndrome values Se(x) of each even numbered codeword R0(x), R2(x), . . . output from the second selector 140 or syndrome values So(x) of each odd numbered codeword R1(x), R3(x), . . . output from the second selector 140.

The error locator polynomial generator 150 calculates an error locator polynomial $\Lambda(x)$ of each codeword or coefficients of the error locator polynomial when all of syndrome values Se(x) and So(x) of each codeword are not 0, i.e., there is at least an error in the each codeword.

Accordingly, the ECC block 20 may further include an error check block (not shown), which may determine whether syndrome values Se(x) or So(x) on each code word are all 0 or not. Here, the error locator polynomial generator 150 may bypass the codeword, or calculate an error locator polynomial of the codeword or coefficients of an error locator polynomial according to a determination result of the error check block, or an output signal of a separate circuit block processing the determination result of the error check block.

A Chien search or a Chien search block 160, which may be embodied as an example of an error locator calculator, may calculate roots of an error locator polynomial from the error locator polynomial or the coefficients of the error locator polynomial, and calculate a plurality of error locators EP according to a calculation result.

FIG. 3 is a block diagram of a first selection signal generator. Referring to FIGS. 2 and 3, a first selection signal generator 180, which may generate a first selection signal SEL1, includes an ECC-pulse generator 182 and a one-bit counter 184.

The ECC-pulse generator 182 generates a plurality of pulses P having a desired (or, alternatively a predetermined) period or cycle in response to a clock signal CLK. The period or cycle may be determined according to the bit number of each of a plurality of code words R(x) or a length of each of a plurality of code words R(x) input to the first selector 110.

The one-bit counter 184 counts the number of the plurality of pulses P output from the ECC-pulse generator 182 and generates an one-bit first selection signal SELL. For example, the first selection signal SEL1 may be in a first state, e.g., data 0, or a second state, e.g., data 1.

Figure 4:
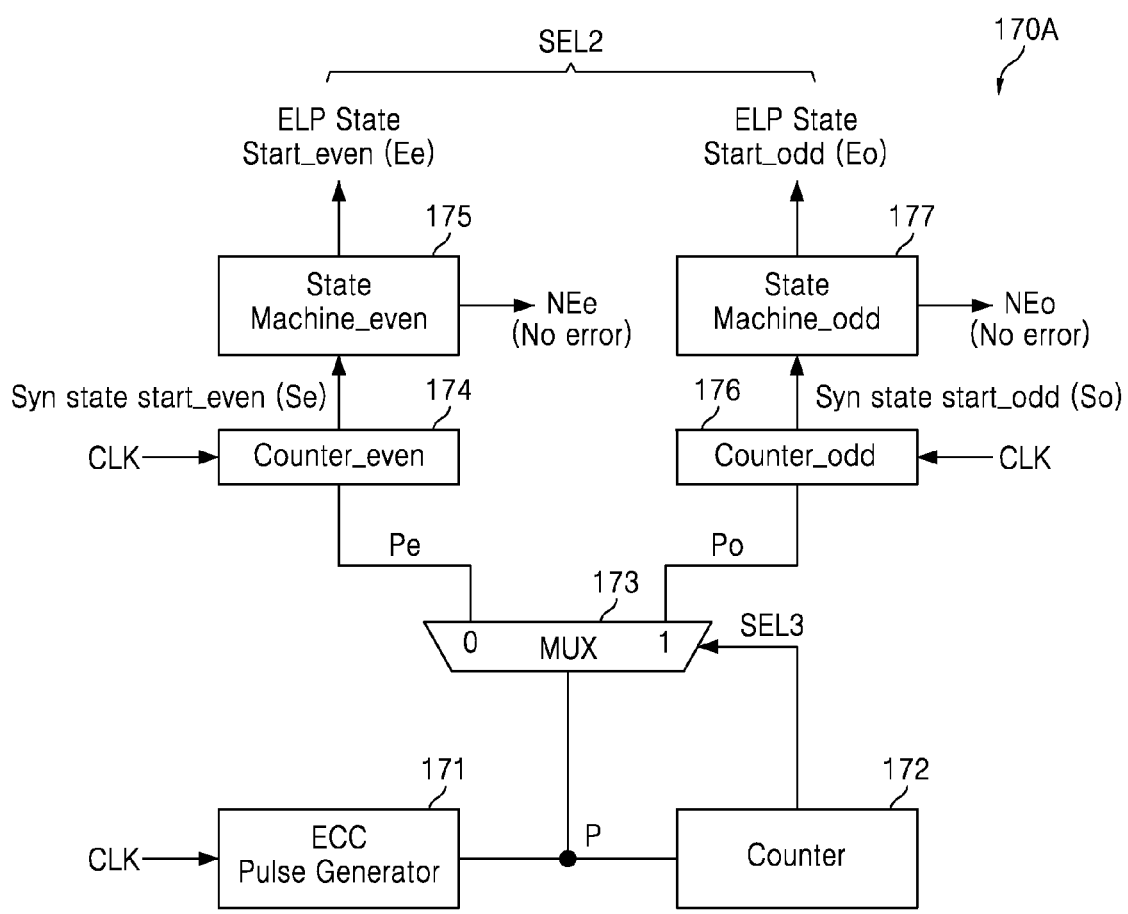
FIG. 4 is a block diagram illustrating an example embodiment of a second selection signal generator.

FIG. 4 is a block diagram illustrating an example embodiment of a second selection signal generator. Referring to FIGS. 2 and 4, a second selection signal generator 170A of FIG. 4, which is embodied in an example of the second selection signal generator 170 of FIG. 2, includes an ECC-pulse generator 171, an one-bit counter 172, a selector 173, a first counter 174, a first state machine 175, a second counter 176 and a second state machine 177.

The ECC-pulse generator 171 generates a plurality of pulses P having a desired (or, alternatively a predetermined) cycle as illustrated in FIG. 8 in response to a clock signal CLK. The cycle may be determined according to each bit number or each length of a plurality of code words R(x) input to the first selector 110.

The one-bit counter 172 counts the number of the plurality of pulses P output from the ECC-pulse generator 171 and generates a one-bit third selection signal SEL3. For example, the third selection signal SEL3 may be in a first state (e.g., in case of odd pulse number) or a second state (e.g., in case of even pulse number).

The selector 173, which may be embodied in a multiplexer, may transmit Pe (refer to FIG. 8) among the plurality of pulses P output from the ECC-pulse generator 171 to a first counter 174 according to a third selection signal SEL3 having a first state to transmit syndrome values Se(x) of each even numbered codeword to an error locator polynomial generator 150.

The first counter 174 performs up-count in response to a clock signal CLK, after being initialized in response to a pulse Pe output from the selector 173, and generates a first start signal Syn state start_even, i.e., Se activated when a count value reaches a reference value. Accordingly, the first state machine 175 outputs an Ee signal, i.e., ELP state start-even according to the activated first start signal Syn state start-even, i.e., Se. Here, the first state machine 175 may output a no-error signal NEe when there is no error.

The second selector 140 transmits syndrome values Se(x) of a corresponding even numbered codeword output from the first register 122 to the error locator polynomial generator 150 in response to an Ee signal Ee.

The selector 173 may transmit Po (refer to FIG. 8) among a plurality of pulses P output from the ECC-pulse generator 171 to a second counter 176 according to a third selection signal SEL3 having a second state to transmit syndrome values So(x) of a corresponding odd numbered codeword to the error locator polynomial generator 150.

The second counter 176 performs up-count in response to a clock signal CLK after being initialized in response to a pulse Po output from the selector 173, and generates a second start signal Syn state start-odd, i.e., So activated when a count value reaches a reference value. Accordingly, the second state machine 177 outputs an Eo signal, i.e., ELP state start-odd according to the activated second start signal Syn state start_odd, i.e., So. Here, the second state machine 177 may output a no-error signal NEo when there is no error.

The reference value may be determined by a designer according to a bit number of a codeword.

The second selector 140 transmits syndrome values So(x) of a corresponding odd numbered codeword output from the second register 132 to the error locator polynomial generator 150 in response to an Eo signal.

The second selection signal SEL2 may include an Ee signal and an Eo signal. For example, the second selector 140 may transmit syndrome values Se(x) of a corresponding even numbered codeword to the error locator polynomial generator 150 when an Ee signal has a second state, and transmit syndrome values So(x) of a corresponding odd numbered codeword to the error locator polynomial generator 150 when an Eo signal has a second state.

Figure 5:
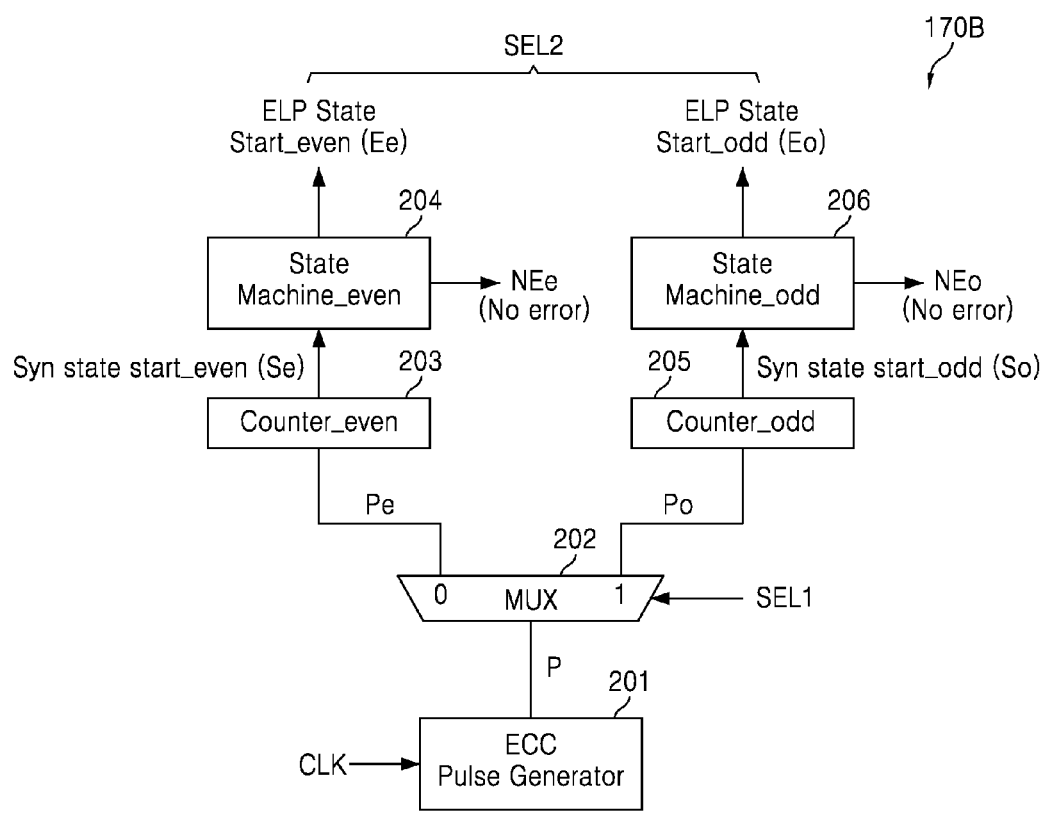
FIG. 5 is a block diagram illustrating another example embodiment of the second selection signal generator.

FIG. 5 is a block diagram illustrating another example embodiment of a second selection signal generator. Referring to FIGS. 2 and 5, a second selection signal generator 170B, which is embodied in another example of the second selection signal generator 170 illustrated in FIG. 2, includes an ECC-pulse generator 201, a selector 202, a first counter 203, a first state machine 204, a second counter 205 and a second state machine 206.

An ECC-pulse generator 201 generates a plurality of pulses having a desired (or, alternatively a predetermined) cycle as illustrated in FIG. 8 in response to a clock signal CLK. The cycle may be determined according to the bit number or a length of each of the plurality of code words R(x) input to the first selector 110.

The selector 202, which may be embodied in a multiplexer, may transmit Pe (refer to FIG. 8) among pulses P output from the ECC pulse generator 171 to a first counter 203 according to a first selection signal SEL1 having a first state to transmit syndrome values Se(x) of each even numbered codeword to the error locator polynomial generator 150.

The first counter 203 performs up-count in response to a clock signal CLK after being initialized in response to a pulse Pe output from the selector 202, and generates a first start signal Syn state start_even, i.e., Se activated when a count value reaches a reference value. Accordingly, a first state machine 204 outputs an Ee signal, i.e., EPL state start_even according to the activated first start signal Syn state start_even, i.e., Se. Here, the first state machine 204 may output a no-error signal NEe when there is no error.

The second selector 140 transmits syndrome values Se(x) of a corresponding even numbered codeword output from a first register 122 to the error locator polynomial generator 150 in response to an Ee signal.

The selector 202 may transmit Po (refer to FIG. 8) among pulses P output from the ECC-pulse generator 201 to a second counter 205 according to a first selection signal SEL1 having a second state to transmit syndrome values So(x) of a corresponding odd numbered codeword to the error locator polynomial generator 150.

The second counter 205 performs up-count in response to a clock signal CLK after being initialized in response to a pulse Po output from the selector 202, and generates a second start signal Syn state start_odd, i.e., So activated when a count value reaches a reference value. Accordingly, a second state machine 206 outputs an Eo signal, i.e., ELP state start_odd according to the activated second start signal Syn state start_odd, i.e., So. Here, the second state machine 206 may output a no-error signal NEo when there is no error.

The second selector 140 transmits syndrome values So(x) of a corresponding odd numbered codeword output from a second register 132 to the error locator polynomial generator 150 in response to the Eo signal.

Figure 6:
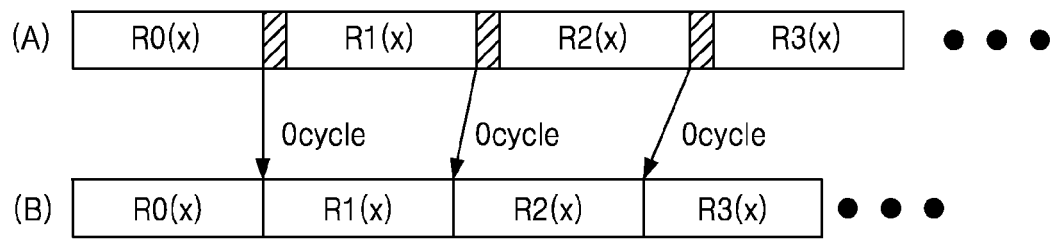
FIG. 6 illustrates transmission of conventional code words and transmission of code words according to an example embodiment of inventive concepts.

FIG. 6 illustrate transmission of conventional code words and transmission of code words according to an example embodiment. Referring to (A) of FIG. 6, there is delay or latency like a diagonal section between a plurality of code words used in a conventional system.

Suppose that there is even a delay of one clock cycle between neighboring two code words e.g., R0(x) and R1(x), a delay of several clock cycles to tens of clock cycles would be needed additionally in some cases for stabilization of a signal due to the delay in a system operating in high speed, e.g., a NAND flash memory system.

However, as illustrated in (B) of FIG. 6, in the system 10 including the ECC block 20 including the dual-syndrome generator 120 and 130, when a time taken to calculate an error locator polynomial and a Chien search time are included in a time taken to transmit a codeword(s), there is no delay or very small delay between two neighboring code words e.g., R0(x) and R1(x).

Figure 7:
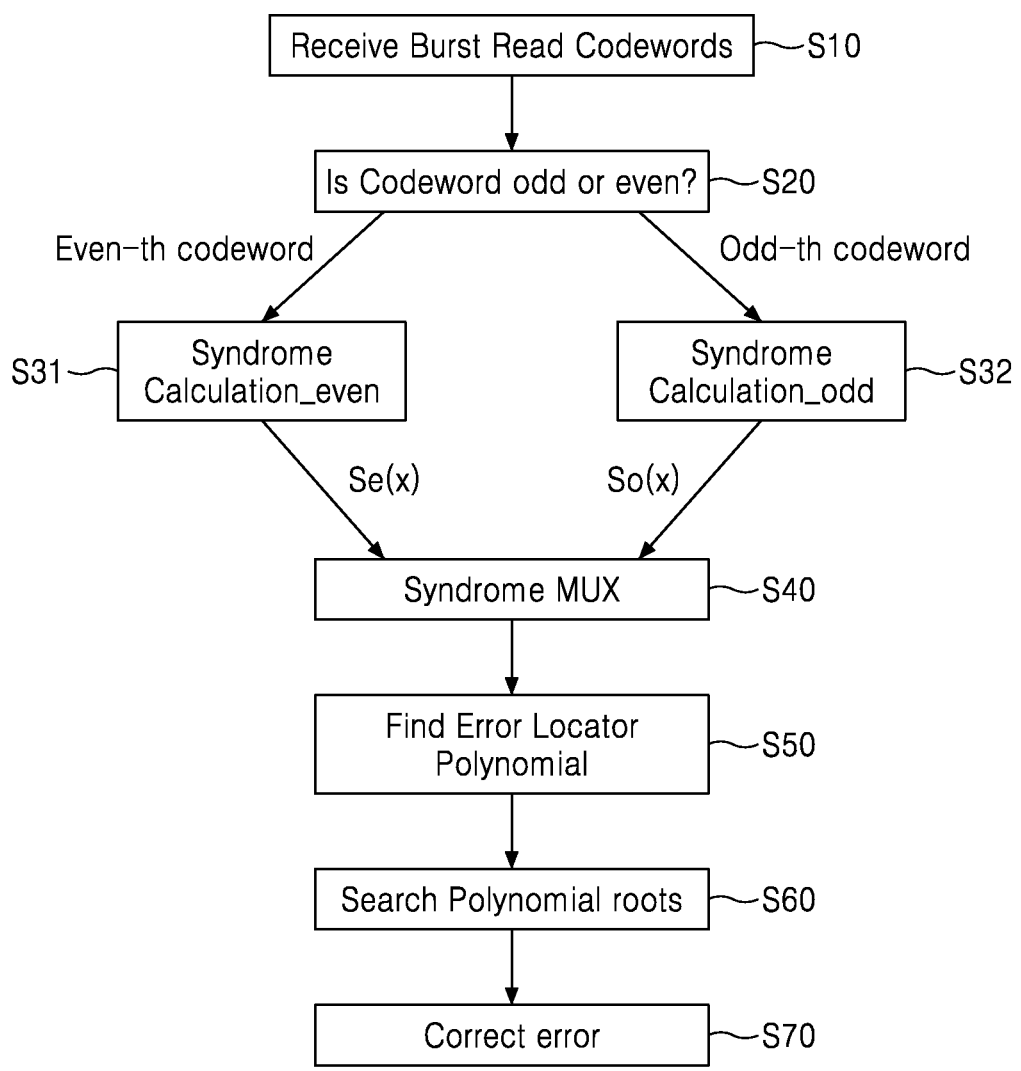
FIG. 7 is a flowchart for explaining an operation of the dual-syndrome generator illustrated in FIG. 1.

FIG. 7 is a flowchart for explaining an operation of the dual-syndrome generator illustrated in FIG. 1. Referring to FIGS. 1 to 7, the ECC block 20 receives a plurality of code words R(x), i.e., burst read code words R(x) (S10).

The first selection signal SELL has a different state according to whether each of the plurality of code words R(x) is an even numbered codeword or an odd numbered codeword (S20).

For example, the first selector 110 transmits a corresponding even numbered codeword R0(x), R2(x), . . . among the plurality of code words R(x) to the first syndrome generator 120 according to the first selection signal SELL having a first state. The first syndrome generator 120 calculates syndrome values from a corresponding even numbered code word R0(x), R2(x), . . . (S31).

Then, the first selector 110 transmits a corresponding odd numbered code word R1(x), R3(x), . . . among the plurality of code words R(x) to the second syndrome generator 130 according to the first selection signal SEL1 having a second state. The second syndrome generator 130 calculates syndrome values from a corresponding odd numbered codeword R1(x), R3(x), . . . (S32).

As explained above, according to a second selection signal SEL2 including an Ee signal having a second state, the second selector 410 transmits syndrome values Se(x) of a corresponding even numbered codeword R0(x), R2(x), . . . stored in a first register 122 to the error locator polynomial generator 150 (S40). In addition, according to a second selection signal SEL2 including an Eo signal having a second state as explained above, the second selector 410 transmits syndrome values So(x) of a corresponding odd numbered codeword R1(x), R3(x), . . . stored in a second register 132 to the error locator polynomial generator 150 (S40).

The error locator polynomial generator 150 calculates an error locator polynomial Λ(x) from syndrome values Se(x) of a corresponding even numbered codeword R0(x), R2(x), . . . or an error locator polynomial Λ(x) from syndrome values So(x) of a corresponding odd numbered codeword R1(x), R3(x), . . . (S50).

The Chien search 160 searches roots of a polynomial by using Chien search from an error locator polynomial Λ(x) output from the error locator polynomial generator 150 and outputs a plurality of error locators (or error locations) EP (S60). The correction DMA 22 corrects an error of each codeword stored in the data buffer 18 by using a plurality of error locators EP of each codeword output from the Chien search 160(S70).

FIG. 8 is a timing diagram for explaining an operation of the dual-syndrome generator illustrated in FIG. 1.

Referring to FIGS. 1 to 8, the second selector 140 transmits syndrome values Se(x) of a corresponding even numbered codeword R0(x), R2(x), . . . stored in the first register 122 to the error locator polynomial generator 150 according to a second selection signal SEL2 including an Ee signal having a second state, and transmits syndrome values So(x) of a corresponding odd numbered codeword R1(x), R3(x), . . . stored in the second register 132 to the error locator polynomial generator 150 according to a second selection signal SEL2 including an Eo signal having a second state. After syndrome values Se(x) or So(x) are calculated by codeword, it is determined whether all of the calculated syndrome values Se(x) or So(x) are 0 or not (No error check).

An error correction code circuit including a dual-syndrome generator according to an example embodiment of inventive concepts may process a plurality of code words which are continuous without latency.

Accordingly, a system including the error correction code circuit may operate at high speed.

Although a few embodiments of the present general inventive concepts have been shown and described, it will be appreciated by those skilled in the art that changes may be made in these embodiments without departing from the principles and spirit of the general inventive concept, the scope of which is defined in the appended claims and their equivalents.

What is claimed is:
1. An error correction code (ECC) circuit comprising:
   a first syndrome generator configured to determine first syndrome values;
   a second syndrome generator configured to determine second syndrome values;
   a de-multiplexer including,
      an input terminal,
      a first output terminal, and
      a second output terminal,
   the de-multiplexer being configured to receive a plurality of codewords, which are input continuously, through the input terminal,
   the de-multiplexer being configured to transmit even numbered codewords among the plurality of codewords, only to the first syndrome generator through the first output terminal in response to a first selection signal having a first state,
   the de-multiplexer being configured to transmit odd numbered codewords among the plurality of codewords only to the second syndrome generator through the second output terminal of the de-multiplexer in response to the first selection signal having a second state different from the first state, the de-multiplexer being configured to transmit only the even numbered codewords through the first output terminal, and the de-multiplexer being configured to transmit only the odd numbered codewords through the second output terminal; and a multiplexer selector configured to transmit syndrome values determined by one of the first syndrome generator and the second syndrome generator to an error locator polynomial generator circuit in response to a second selection signal.

2. The ECC circuit of claim 1, further comprising:
a pulse generator configured to generate a plurality of pulses having a cycle in response to a clock signal; and
a counter configured to count the number of the plurality of pulses and configured to generate the first selection signal according to a count result.

3. The ECC circuit of claim 2, wherein the cycle is determined according to the bit number of each of the plurality of codewords.

4. The ECC circuit of claim 1, wherein
the first syndrome generator, based on a previous codeword stored in a first register and a current even-numbered codeword, is configured to calculate, as the first syndrome values, syndrome values of the current even numbered codeword and output the calculated first syndrome values to the first register, the second syndrome generator, based on a previous codeword stored in a second register and a current odd-numbered codeword, is configured to calculate, as the second syndrome values, syndrome values of the current odd-numbered codeword and output calculated second syndrome values to the second register.

5. The ECC circuit of claim 4, further comprising:
the error locator polynomial generator circuit;
wherein the multiplexer selector is configured to transmit syndrome values output from one of the first register and the second register to the error locator polynomial generator circuit in response to the second selection signal.

6. The ECC circuit of claim 1,
wherein the multiplexer selector is configured to transmit one of syndrome values of the even numbered codewords generated by the first syndrome generator and syndrome values of the odd numbered codewords generated by the second syndrome generator to an error locator polynomial generator circuit in response to the second selection signal.

7. The ECC circuit of claim 6, further comprising:
a pulse generator configured to generate a plurality of pulses having a cycle determined according to the bit number of each of the plurality of codewords in response to a clock signal;
a one-bit counter configured to count the number of the plurality of pulses and generating a third selection signal;
a third selector configured to output the plurality of pulses output from the pulse generator to one of a first output terminal and a second output terminal according to the third selection signal;
a first counter configured to perform up-count in response to the clock signal after being initialized in response to an output signal of the first output terminal and output a first start signal corresponding to a result of comparing a count value with a reference value;

a first state machine configured to output the second selection signal in response to the first start signal;
a second counter configured to perform up-count in response to the clock signal after being initialized in response to an output signal of the second output terminal and output a second start signal corresponding to a result of comparing a count value with the reference value; and
a second state machine configured to output the second selection signal in response to the second start signal.

8. The ECC circuit of claim 6, further comprising:
a pulse generator configured to generate a plurality of pulses having a cycle determined according to the bit number of each of the plurality of codewords in response to a clock signal;
a second selector configured to output an even numbered pulse among the plurality of pulses to a first output terminal and output an odd numbered pulse among the plurality of pulses to a second output terminal in response to the first selection signal;
a first counter configured to count the clock signal after being initialized in response to an output signal of the first output terminal and output a first start signal corresponding to a result of comparing a count value with a reference value;
a first state machine configured to output the second selection signal in response to the first start signal;
a second counter configured to count the clock signal after being initialized in response to an output signal of the second output terminal and output a second start signal corresponding to a result of comparing a count value with the reference value; and
a second state machine configured to output the second selection signal in response to the second start signal.

9. The ECC circuit of claim 1,
wherein the de-multiplexer is configured such that the transmissions of the even numbered codeword and the odd numbered codewords by the de-multiplexer are consecutive transmissions, the first syndrome generator being configured to generate a first syndrome based on the even numbered codewords, the second syndrome generator being configured to generate a second syndrome based on the odd numbered codewords,
the ECC circuit further comprising:
an error locator polynomial generator configured to generate first and second error locator polynomials based on the first syndrome and the second syndrome, respectively; and
a search unit configured to apply a search algorithm to the first and second error locator polynomials to generate first and second error locators, respectively,
the ECC circuit being configured such that the second syndrome generator begins generating the second syndrome before the error locator polynomial generator begins generating the first error locator polynomial.

10. The ECC circuit of claim 9 wherein the search unit is a Chien search unit configured to generate the first and second error locators by applying a Chien search algorithm to the first and second error locator polynomials.

11. A system comprising:
a first-in first-out (FIFO) buffer configured to receive a plurality of codewords output successively from a memory;
a data buffer configured to store the plurality of codewords output from the FIFO buffer;
an error correction code (ECC) circuit configured to generate syndrome values by using a syndrome generator, which is selected according to an order of the plurality of codewords output from the memory among a plurality of syndrome generators, calculate an error locator polynomial from the generated syndrome values, calculate roots of the calculated error locator polynomial, and output a plurality of error locations from the calculated roots;

a correction direct memory access (DMA) configured to correct an error included in a codeword read from the data buffer by codeword and store an error-corrected codeword in the data buffer by using the plurality of error locations;

a host interface configured to transmit the error-corrected codeword stored in the correction DMA to a host, the plurality of syndrome generators including a first syndrome generator configured to determine first syndrome values and a second syndrome generator configured to determine second syndrome values, the ECC circuit including,
a de-multiplexer including,
an input terminal,
a first output terminal, and
a second output terminal,
the de-multiplexer being configured to receive the plurality of codewords, which are input continuously, through the input terminal,
the de-multiplexer being configured to transmit even numbered codewords among the plurality of codewords, only to the first syndrome generator through the first output terminal of the de-multiplexer in response to a first selection signal having a first state and transmit odd numbered codewords among the plurality of codewords only to the second syndrome generator through the second output terminal of the de-multiplexer in response to the first selection signal having a second state different from the first state,
the de-multiplexer being configured to transmit only the even numbered codewords through the first output terminal, and
the de-multiplexer being configured to transmit only the odd numbered codewords through the second output terminal, wherein the first selection signal is generated according to the order; and
a multiplexer selector configured to transmit syndrome values determined by one of the first syndrome generator and the second syndrome generator to an error locator polynomial generator circuit in response to a second selection signal.

12. The system of claim 11,
wherein the multiplexer is configured to output syndrome values output from one of the first syndrome generator and the second syndrome generator in response to the second selection signal generated according to the order, and
wherein the ECC circuit further comprises:
an error locator polynomial generator configured to calculate the error locator polynomial from syndrome values output from the multiplexer; and
an error locator calculator configured to calculate roots of the error locator polynomial and output the plurality of error locations according to a calculation result.

13. The system of claim 12, wherein the ECC circuit further comprises:
a pulse generator configured to generate a plurality of pulses having a cycle determined according to each bit number of the plurality of codewords in response to a clock signal; and a counter configured to count the number of the plurality of pulses and generate the first selection signal according to a count result.

14. The system of claim 12, when the ECC circuit further comprises:
a first register and a second register,
wherein the first syndrome generator, based on a previous codeword stored in the first register and a current even-numbered codeword, is configured to calculate the first syndrome values of the current even numbered codeword and output the calculated first syndrome values to the first register,
wherein the second syndrome generator, based on a previous codeword stored in the second register and a current odd-numbered codeword, is configured to calculate the second syndrome values of the current odd numbered codeword and output the calculated second syndrome values to the second register,
wherein the second selection circuit is configured to output syndrome values stored in the first register or the second register to the error locator polynomial generator in response to the second selection signal.

15. The system of claim 11, wherein the system is one of a mobile phone, a smart phone, a tablet PC and a memory card.

16. An error correction code (ECC) circuit, comprising:
at least first and second processing paths,
the first processing path being configured to generate first syndrome values for a first series of codewords output from a memory and including a first syndrome generator,
the second processing path being configured to generate second syndrome values for a second series of codewords output from the memory and including a second syndrome generator,
the first and second series of codewords including different codewords;
a de-multiplexer including,
an input terminal,
a first output terminal, and
a second output terminal,
the de-multiplexer being configured to receive the first and second series of codewords, which are input continuously, through the input terminal,
wherein the first syndrome generator is configured to connect the first output terminal of the de-multiplexer in response to a first selection signal having a first state, and
wherein the second syndrome generator is configured to connect the second output terminal of the de-multiplexer in response to the first selection signal having a second state different from the first state; and
a multiplexer selector configured to transmit syndrome values generated by one of the first processing path and the second processing path to an error locator polynomial generator circuit in response to a second selection signal.

17. The ECC circuit of claim 16, wherein the first series of codewords includes even numbered codewords output from the memory, and the second series of codewords includes odd numbered codewords output from the memory.

18. The ECC circuit of claim 16, further comprising:
a selector configured to selectively direct the codewords output from the memory to one of the first processing path and the second processing path.

19. The ECC circuit of claim 16, wherein
the first processing path includes the first syndrome generator and a first register, the first syndrome generator is configured to generate the first syndrome values with respect to a current codeword in the first series of codewords based on a previous codeword in the first series of codewords stored in the first register and the current codeword in the first series of codewords; and the second processing path includes the second syndrome generator and a second register, the second syndrome generator is configured to generate the second syndrome values with respect to a current codeword in the second series of codewords based on a previous codeword in the second series of codewords stored in the second register and the current codeword in the second series of codewords.

20. The ECC circuit of claim 19, further comprising:
the error locator polynomial generator, the error locator polynomial generator being configured to generate one of error locator polynomials and error locator polynomial coefficients from output of the first and second processing paths.

21. The ECC circuit of claim 20, further comprising:
a search block configured to generate error locators based on output from the error locator polynomial generator.

22. The ECC circuit of claim 16, further comprising:
the error locator polynomial generator, the error locator polynomial generator being configured to generate first and second error locator polynomials based on the syndrome values generated by the first and second processing paths, respectively; and
a search unit configured to apply a search algorithm to the first and second error locator polynomials to generate first and second error locators, respectively.

23. The ECC circuit of claim 22 wherein the search unit is a Chien search unit configured to generate the first and second error locators by applying a Chien search algorithm to the first and second error locator polynomials.

* * * * *